(12) United States Patent
Lin et al.

(10) Patent No.: US 8,344,481 B2
(45) Date of Patent: Jan. 1, 2013

(54) BIPOLAR TRANSISTORS WITH HUMP REGIONS

(75) Inventors: Xin Lin, Phoenix, AZ (US); Bernhard H. Grote, Phoenix, AZ (US); Hongning Yang, Chandler, AZ (US); Jiang-Kai Zuo, Chandler, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 13/041,531

(22) Filed: Mar. 7, 2011

(65) Prior Publication Data

US 2011/0147893 A1     Jun. 23, 2011

Related U.S. Application Data

(62) Division of application No. 12/142,115, filed on Jun. 19, 2008, now Pat. No. 7,927,955.

(51) Int. Cl.
*H01L 29/66* (2006.01)
(52) U.S. Cl. .. 257/565; 257/591; 257/592; 257/E27.074
(58) Field of Classification Search ............... 257/565, 257/591, 592, E27.074
See application file for complete search history.

(56) References Cited

U.S. PATENT DOCUMENTS

| | | | |
|---|---|---|---|
| 4,416,708 A * | 11/1983 | Abdoulin et al. | 438/375 |
| 5,386,140 A | 1/1995 | Matthews | |
| 5,496,746 A | 3/1996 | Matthews | |
| 6,570,242 B1 * | 5/2003 | Johnson | 257/593 |
| 2004/0080883 A1 * | 4/2004 | Chatterjee et al. | 361/56 |
| 2004/0082136 A1 | 4/2004 | Hutcheson | |
| 2006/0118881 A1 | 6/2006 | Ren et al. | |
| 2008/0054407 A1 | 3/2008 | Ko | |

* cited by examiner

*Primary Examiner* — Julia Slutsker
(74) *Attorney, Agent, or Firm* — Ingrassia Fisher & Lorenz, P.C.

(57) ABSTRACT

By providing a novel bipolar device design implementation, a standard CMOS process can be used unchanged to fabricate useful bipolar transistors and other bipolar devices having adjustable properties by partially blocking the P or N well doping used for the transistor base. This provides a hump-shaped base region with an adjustable base width, thereby achieving, for example, higher gain than can be obtained with the unmodified CMOS process alone. By further partially blocking the source/drain doping step used to form the emitter of the bipolar transistor, the emitter shape and effective base width can be further varied to provide additional control over the bipolar device properties. The embodiments thus include prescribed modifications to the masks associated with the bipolar device that are configured to obtain desired device properties. The CMOS process steps and flow are otherwise unaltered and no additional process steps are required.

12 Claims, 5 Drawing Sheets

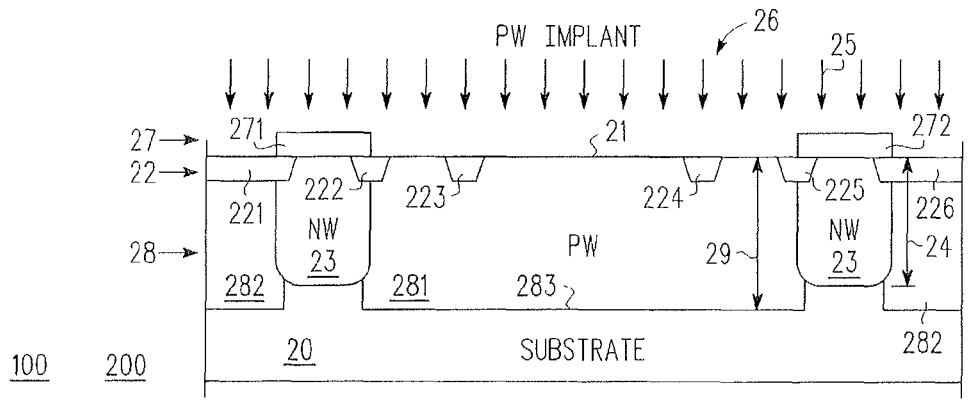
*FIG. 1* - PRIOR ART -
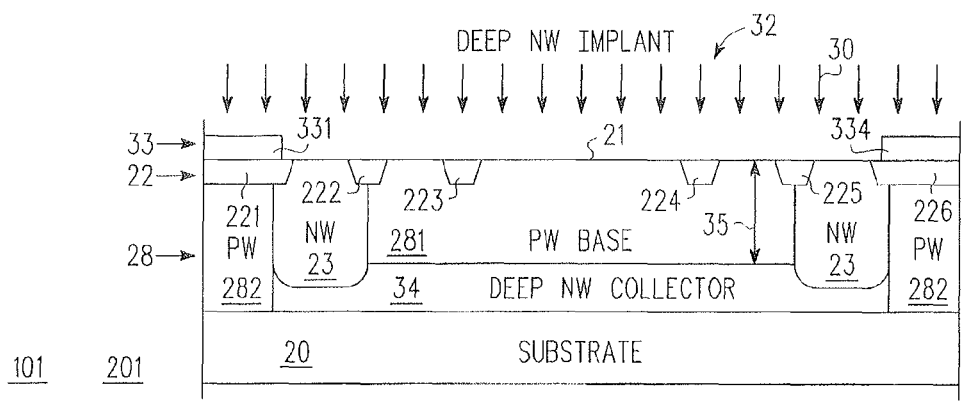
*FIG. 2* - PRIOR ART -
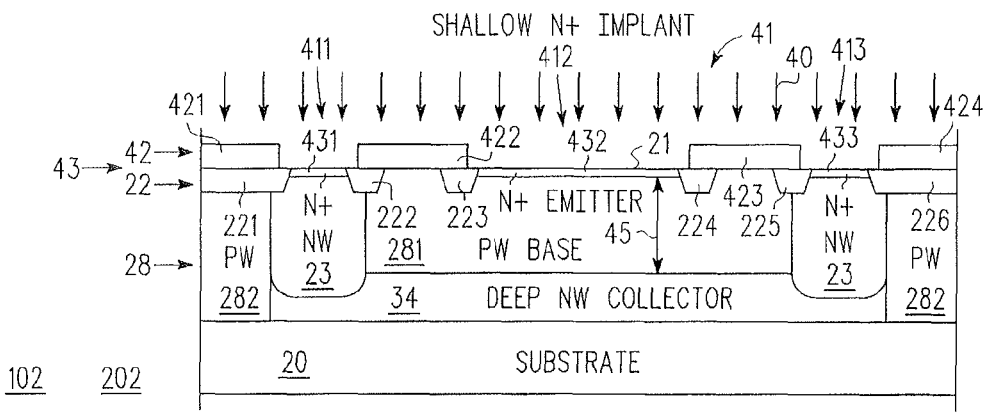
*FIG. 3* - PRIOR ART -

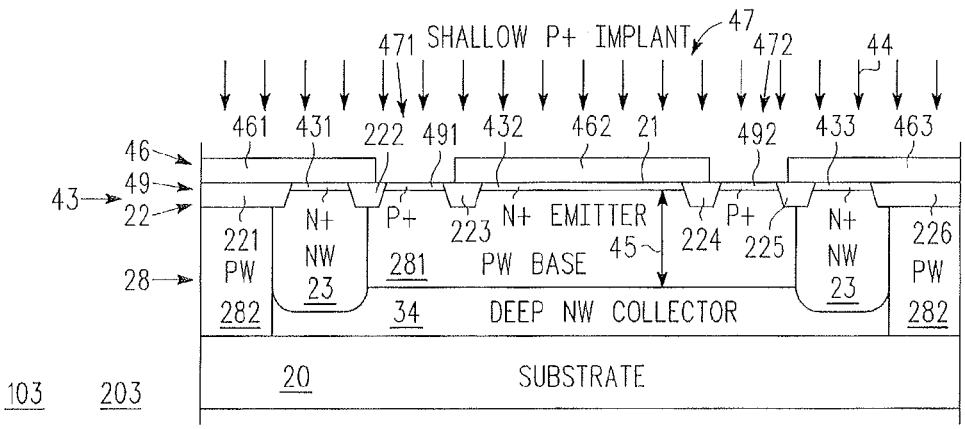
*FIG. 4* - PRIOR ART -
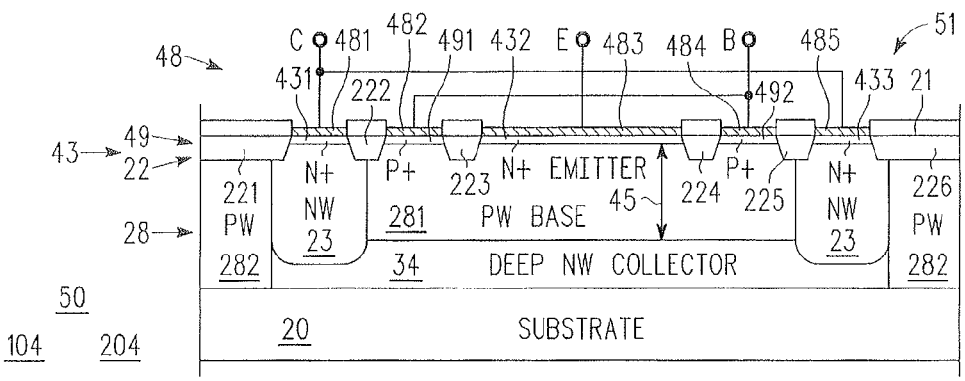
*FIG. 5* - PRIOR ART -
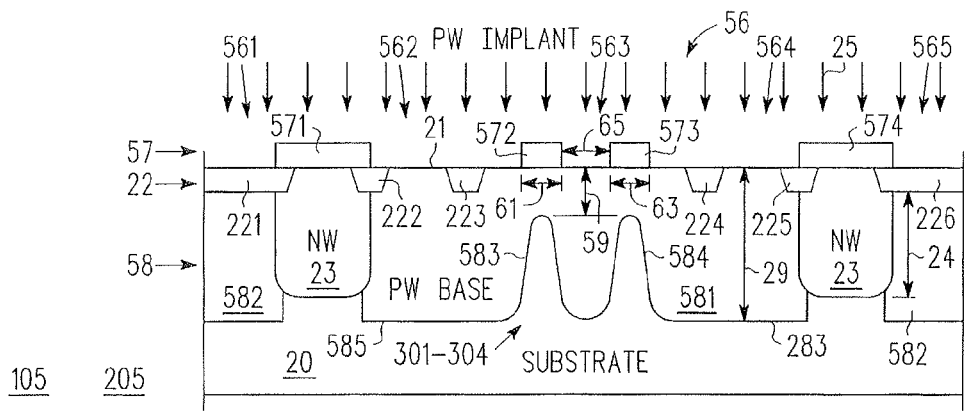
*FIG. 6*

BIPOLAR TRANSISTORS WITH HUMP REGIONS

CROSS REFERENCE TO RELATED APPLICATION

This application is a divisional of co-pending U.S. patent application Ser. No. 12/142,115, filed on Jun. 19, 2008.

FIELD OF THE INVENTION

The present invention generally relates to semiconductor (SC) devices and integrated circuits (ICs) and, more particularly, structures and methods for forming adjustable bipolar transistors using a process optimized for field effect devices.

BACKGROUND

Field effect transistors (FETs) and especially complementary metal-oxide-semiconductor (CMOS) field effect transistors (collectively "MOSFETs") are much used in complex integrated circuits (ICs). It will be understood that the abbreviations MOS, CMOS and MOSFET and the words for which they stand are used in conjunction with devices that employ other types of conductors and dielectrics besides metals and oxides. Accordingly, the terms MOSFET, MOS and CMOS and the words for which they stand, as used herein, are not intended to be limited merely to structures and methods employing metal conductors and oxide dielectrics but apply to devices, ICs and processes therefore that employ any form or composition of conductor and any form or composition of dielectric in conjunction with a semiconductor substrate, including and not limited to substrates that are single crystal or poly-crystalline or thin film or semiconductor-on-insulator or combinations thereof, collectively referred to herein as a "semiconductor substrate." The term "semiconductor" is abbreviated as "SC."

Because of the great functional complexity that can be achieved using MOSFETs, especially CMOS devices, the processes for manufacturing such devices and ICs are often highly optimized so as to maximize the manufacturing yield and minimize the manufacturing cost. Manufacturing steps that are not essential for construction of ICs based on MOS-FETS and CMOS devices are usually eliminated or deemed "non-standard". Manufacturing flexibility is sacrificed in order to optimize the manufacturing process flow and minimize the manufacturing cost of such ICs. While such tradeoffs are desirable for efficient manufacture of ICs that employ MOSFETs and/or CMOS devices, they can become a significant handicap when the need arises to incorporate other types of devices, as for example and not limited to, bipolar transistors in the same ICs. Process parameters that are optimized for production of MOSFETs and/or CMOS devices may be, for example, ill-suited to manufacture of bipolar transistors of the desired properties on the same semiconductor substrate. The problem may be overcome by incorporating additional or modified process steps particularly adapted to form the desired bipolar transistors into the basic MOSFET or CMOS manufacturing flow. However, such additional or modified process steps undesirably add cost and complexity to the manufacturing process, and if possible should be avoided. Accordingly, there is an ongoing need to provide improved fabrication methods and structures for semiconductor devices and ICs capable of providing bipolar transistors and other non-field effect devices, using a process that is optimized for production of MOSFET and/or CMOS devices, without significantly adding to or modifying the basic manufacturing process flow or manufacturing steps for such field effect devices.

BRIEF DESCRIPTION OF THE DRAWINGS

The present invention will hereinafter be described in conjunction with the following drawing figures, wherein like numerals denote like elements, and wherein:

FIGS. 1-5 are simplified schematic cross-sectional views of a bipolar transistor at different stages of manufacture using an established CMOS process, illustrating the device limitations that can arise therefrom; and FIGS. 6-10 are simplified schematic cross-sectional views of an improved and adjustable bipolar transistor at different stages of manufacture according to an embodiment of the present invention, wherein mask changes provide novel bipolar transistors of superior properties using the CMOS process of FIGS. 1-5 without adding process steps or modifying the CMOS process flow.

DETAILED DESCRIPTION

Figure 7:
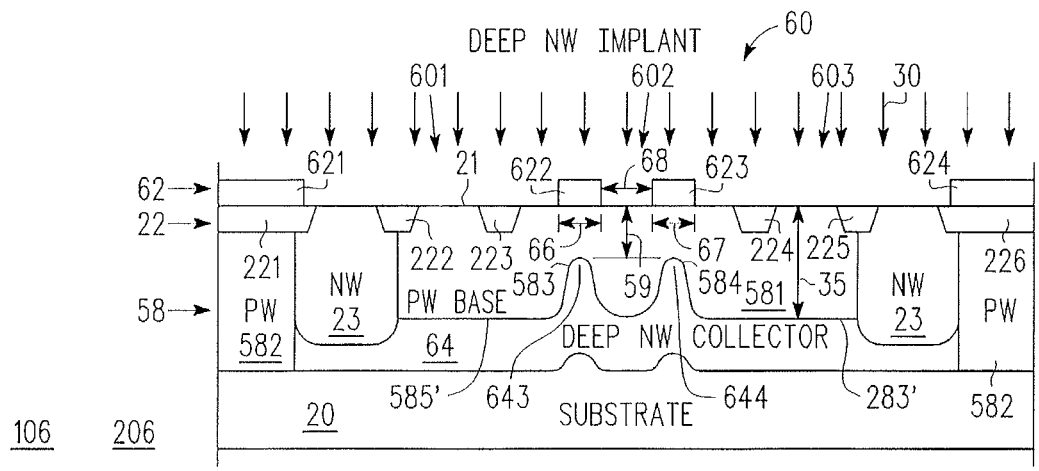

The following detailed description is merely exemplary in nature and is not intended to limit the invention or the application and uses of the invention. Furthermore, there is no intention to be bound by any expressed or implied theory presented in the preceding technical field, background, or the following detailed description.

For simplicity and clarity of illustration, the drawing figures illustrate the general manner of construction, and descriptions and details of well-known features and techniques may be omitted to avoid unnecessarily obscuring the invention. Additionally, elements in the drawings figures are not necessarily drawn to scale. For example, the dimensions of some of the elements or regions in the figures may be exaggerated relative to other elements or regions to help improve understanding of embodiments of the invention.

The terms "first," "second," "third," "fourth" and the like in the description and the claims, if any, may be used for distinguishing between similar elements and not necessarily for describing a particular sequential or chronological order. It is to be understood that the terms so used are interchangeable under appropriate circumstances such that the embodiments of the invention described herein are, for example, capable of operation in sequences other than those illustrated or otherwise described herein. Furthermore, the terms "comprise," "include," "have" and any variations thereof, are intended to cover non-exclusive inclusions, such that a process, method, article, or apparatus that comprises a list of elements is not necessarily limited to those elements, but may include other elements not expressly listed or inherent to such process, method, article, or apparatus. The term "coupled," as used herein, is defined as directly or indirectly connected in an electrical or non-electrical manner. For convenience of explanation and not intended to be limiting, the semiconductor devices and methods of fabrication are described herein for silicon semiconductors, but persons of skill in the art will understand that other semiconductor materials can also be used. The term "poly-semiconductor" standing for a poly-crystalline semiconductor or other conductive material whether semiconductor or not, is abbreviated as "poly-SC". Similarly, polycrystalline silicon is abbreviated as Poly-Si.

The various embodiments of the invention described here are illustrated by semiconductor devices and structures of particular conductivity type having various P and N doped regions appropriate for that conductivity type device or structure. But this is merely for convenience of explanation and not intended to be limiting. Persons of skill in the art will understand that devices or structures of opposite conductivity type may be provided by interchanging conductivity types so that a P-type region becomes an N-type region and vice versa. Alternatively, the particular regions illustrated in what follows may be more generally referred to as of a "first conductivity type" and a "second" opposite conductivity type", where the first conductivity type may be either N or P type and the second opposite conductivity type is then either P or N type, and so forth. Further, for convenience of explanation and not intended to be limiting, various embodiments of the present invention are described herein for silicon semiconductors, but persons of skill in the art will understand the invention is not limited to silicon but applies to a wide variety of semiconductor materials. Non-limiting examples are other type IV semiconductor materials, as well as type III-V and II-VI semiconductor materials and combinations thereof, whether in bulk single crystal form or in thin film form or semiconductor-on-insulator form or combinations thereof.

FIGS. 1-5 are simplified schematic cross-sectional views of a bipolar transistor at different stages of manufacture using an established CMOS process, illustrating the device limitations that can arise therefrom. Referring now to manufacturing stage 100 of FIG. 1, semiconductor (SC) substrate 20 of, for example and not intended to be liming, silicon and in which have previously been formed dielectric regions 221-226 (collectively 22) at surface 21 using means well known in the art and in which have also previously been formed, for example, N-type regions 23 using a standard CMOS N-well (NW) process step. In various embodiments, substrate 20 may be P-type or N-type, depending upon the particular type of device being formed and any requirements imposed by the underlying MOS process. Ion implantation is suitable but other doping processes may also be used for NWs 23. N-wells (NWs) 23 are typically doped to about $1.0 \times 10^{18}$ atoms/cm$^3$ and have depth 24 of for example about 1.0 to 1.5 micrometers, but higher or lower values can also be used. What is important is that the NW doping and depth are fixed to optimize the underlying CMOS process and are used "as-is" in forming the bipolar transistor since the N-wells associated with the CMOS transistors (not shown) are typically being formed elsewhere on SC substrate 20 during the same manufacturing step. In manufacturing stage 100, exemplary P-well (PW) implant 25 is provided through opening 26 in mask 27 comprising portions 271, 272 locally associated with the bipolar transistor at the same time that P-wells are being formed for CMOS transistors (not shown) elsewhere on substrate 20 without any process modification for purpose of forming the bipolar transistor. A single energy or multiple energy implants may be used. P-well 281, 282 (collectively 28) are formed thereby having lower boundary 283 at depth 29 beneath surface 21. P-well 281 will eventually form the base of the bipolar transistor. As with the N-well forming step, the P-well forming step accomplished in manufacturing stage 100 is also used "as-is" with only mask modification for defining the bipolar transistor. P-well (PW) 28 is typically doped to about $1.0 \times 10^{18}$ atoms/cm$^3$ and has depth 29 of for example about 1.0 to 1.2 micrometers, but higher or lower values can also be used. Structure 200 results.

In manufacturing stage 101 of FIG. 2, deep N-well implant 30 is usefully provided into substrate 20 through opening 32 in mask 331, 334 (collectively 33) so as to form deep NW collector region 34 producing a PN junction with PW 281 at about depth 35 below surface 21. Implant 30 is typically made at an energy of about 450 to 600 keV, to provide a doping concentration in collector region 34 of about $4.0 \times 10^{16}$ atoms/cm$^3$ and junction depth 35 beneath surface 21 of about 0.7 micrometers, but larger or smaller values may also be used. A single energy or multiple energy implants is suitable. As with the shallow N-well and P-well implants, deep NW implant 30 is used "as is" since this is the same implant being used elsewhere to provide, for example, buried layer regions (not shown) associated with the CMOS circuitry or power MOSFET devices elsewhere on substrate 20. Structure 201 results. In further embodiments, deep NW implant 30 and deep NW collector region 34 formed thereby may be omitted or placed elsewhere, as for example and not intended to be limiting, when a vertical bipolar device is being constructed. For convenience of description it is assumed in the illustrations that follow that deep NW implant 30 is used and deep NW collector region 34 included as shown, but this is not intended to be limiting, and persons of skill in the art will understand based on the description herein that implant 30 and deep NW collector region 34 of FIGS. 3-5 (and deep NW collector region 64 of FIGS. 7-10) may be omitted.

In manufacturing stage 102 of FIG. 3, shallow N+ implant 40 is provided through openings 411, 412, 413 (collectively 41) in mask 421, 422, 423, 424 (collectively 42) to form shallow N+ regions 431, 432, 433 (collectively 43), which serve either as doped contact regions (e.g., regions 431, 433) or as emitter region 432 of the bipolar transistor being formed. Implant 40 typically provides shallow N+ regions 43 doped to about $5.0 \times 10^{20}$ atoms/cm$^3$ and about 0.1 micrometers thick, but larger or smaller values can also be used. Base width 45 is given by the distance between the lower edge of emitter region 432 and the upper edge of collector region 34. Structure 202 results. In manufacturing stage 103 of FIG. 4, shallow P+ implant 44 is provided through openings 471, 472 (collectively 47) in between portions 461, 462, 463 of mask 46 to provide P+ contact regions 491, 492 (collectively 49) in PW base region 281. Implant 44 typically provides shallow P+ regions 49 doped to about $5.0 \times 10^{20}$ atoms/cm$^3$ and about 0.1 micrometers thick, but larger or smaller values can also be used. Again, N+ and P+ implants 40, 44 are used "as is" in conjunction with masks 42 and 46 since they may also be used for the various CMOS devices (not shown) being formed elsewhere on substrate 20 at the same time. Structure 203 results. In manufacturing stage 104 of FIG. 5, mask 46 is removed and contacts 481, 482, 483, 484, 485 (collectively 48) made to N+ and P+ doped regions 43 and 49 and appropriate terminals or interconnections provided to couple finished bipolar device 50 to other devices or terminals (not shown) on the same substrate. Dielectric surface passivation 51 is conventionally provided on surface 21 to laterally separate the various contacts 48. Structure 204 results, providing bipolar transistor 50 having base width 45. While bipolar transistor 50 can be functional, the gain and other properties are controlled by the CMOS process parameters which determine the doping and depth of the various regions of bipolar device 50. Since these CMOS process steps are being used without modification, resulting bipolar device 50 will often not have the desired properties and may not be very useful. A way needs to be found to modify or adjust its properties to suit the requirements of a given device or integrated circuit (IC) implementation, if possible without changing the basic CMOS process parameters and without adding additional manufacturing steps to the basic CMOS process flow.

FIGS. 6-10 are simplified schematic cross-sectional views of improved adjustable bipolar transistor 80 at different stages of manufacture according to an embodiment of the present invention. The bipolar transistor is said to be "adjustable" since, as will be shown, its properties can be varied over a significant range to suit the requirements of a given device or IC implementation. As noted above, this is accomplished by means of unique mask changes to obtain novel bipolar SC device integration within the established CMOS process flow. In manufacturing stages 105, 106, 107, 108, 109 of FIGS. 6-10 the same process steps can be performed as in manufacturing stages 100, 101, 102, 103, 104 of FIGS. 1-5, with the same energies, doses, implant dopant concentrations, depths or thicknesses, etc. Accordingly, the discussion thereof in connection with FIGS. 1-5 is incorporated herein by reference. The difference is in the mask layouts used over the bipolar transistor region during these process steps. No change is needed in the basic CMOS process flow or the design or execution of the process steps themselves. Referring now to manufacturing stage 105 of FIG. 6, substrate 20 is provided having dielectric regions 221-226 (collectively 22) adjacent upper surface 21 of substrate 20, and with NW regions 23 of depth 24 formed therein in the same manner as for manufacturing stage 100 of FIG. 1. PW implant 25 is provided through openings 561, 562, 563, 564, 565 (collectively openings 56) between mask portions 571, 572, 573, 574 (collectively mask 57). Implant 25 is the same as used in connection with manufacturing stage 100 of FIG. 1 and the discussion thereof is incorporated herein by reference. Mask portions 571, 574 are the same as mask portions 271, 272 of mask 27 of FIG. 1. What is different is that mask portions 572, 573 have been added on surface 21 above the location where the emitter will subsequently be formed. Dimensions 61, 63, 65 associated with mask portions 572, 573 are discussed in more detail in connection with FIGS. 11-14. Implant 25 results in PW regions 581, 582 (collectively 58) analogous to regions 281, 282 (collectively 28) of FIG. 1. The presence of mask portions 572, 573 inhibits implantation into the portions of substrate 20 immediately below mask portions 572, 573, with the result that, instead of having substantially planar lower boundary 283 at depth 29 as in FIG. 1, mask portions 572, 573 result in undulating boundary 585 of PW region 581, for example, having two "humps" 583, 584 whose peaks are at much smaller distance 59 below surface 21. Distance 59 is substantially less than depth 29 of implant 25 without mask portions 572, 573. In locations remote from humps 583, 584, PW 581 has lower boundary 283 at depth 29 from surface 21 as in FIG. 1. Structure 205 results. Implant 25 is conveniently the same as used in the basic MOS process illustrated in FIG. 1. Only the mask regions associated with the bipolar transistor have been changed by adding, for example, mask portions 572, 573 and the MOS portions (not shown) of the PW implant mask are not altered.

In manufacturing stage 106 of FIG. 7, mask 62 has portions 621 and 624 in some embodiments, analogous to portions 331, 334 of FIG. 2. In the depicted embodiment, additional exemplary mask portions 622, 623 are also included. Added portions 622, 623 are desirably substantially aligned with mask portions 572, 573 of stage 105 of FIG. 6 and have dimensions 66, 67, 68 analogous to dimensions 61, 63, 65 of manufacturing stage 105 of FIG. 6. In this embodiment, resulting deep NW collector 64 portions 643, 644 follow the contour of undulating boundary 585' with humps 583, 584 of PW base 581 of FIG. 6. Structure 206 results. In other embodiments, mask portions 621-624 may be omitted and deep NW implant 30 used unmasked for the bipolar device. Mask portions 621, 624 may be retained if there are other PW regions 582 that need to be protected from deep NW implant 30. In a preferred embodiment, the deep NW implant is preferably unmasked as far as the bipolar device is concerned. Implant 30 with mask portions 621-624 is illustrated here for convenience of explanation and consistency with the process illustrated in FIGS. 1-5, but this is not intended to be limiting.

Figure 8:
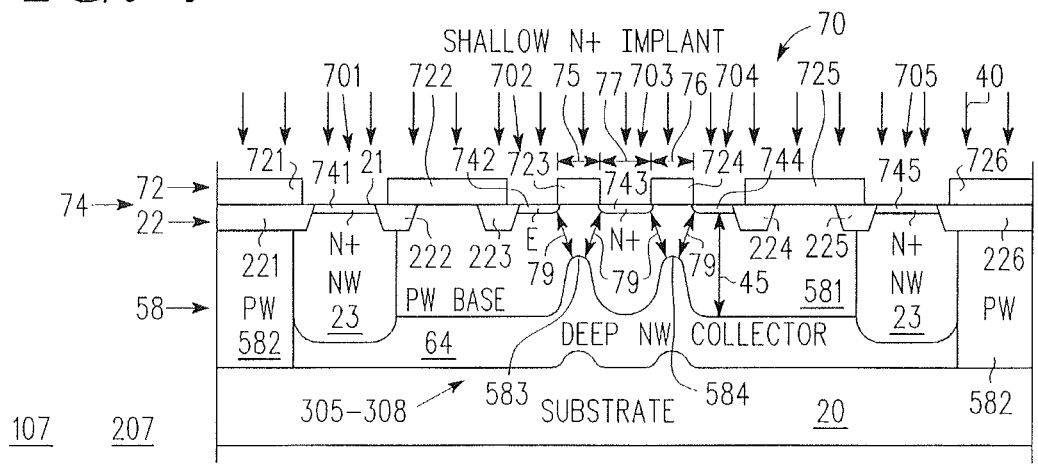
Figure 9:
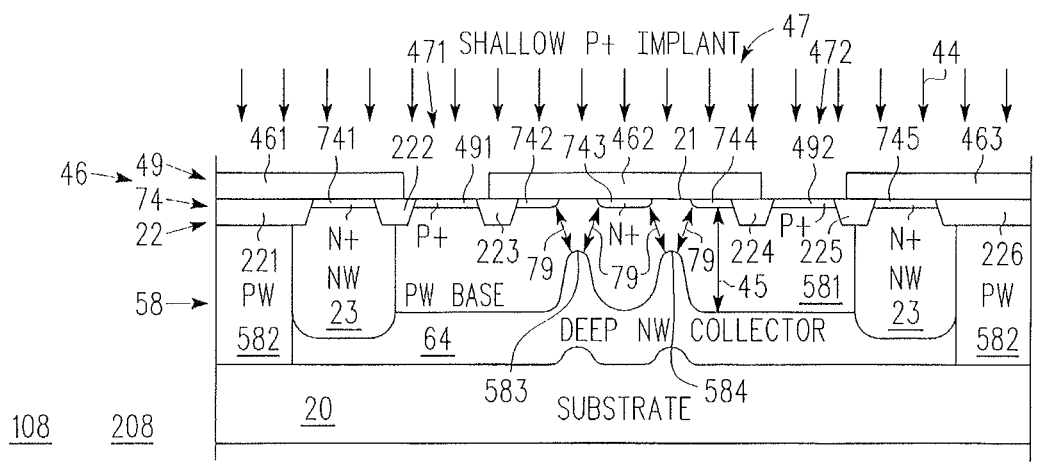

In manufacturing stage 107 of FIG. 8, shallow N+ implant 40 is provided through openings 701-705 (collectively 70) in mask 72 having portions 72-722 and 725-726 the same as portions 421-422 and 423-424 in FIG. 3, plus additional portions 723, 724 of FIG. 8 corresponding to mask portions 572, 573 of FIG. 6 and having dimensions 75, 76 and 77 analogous to dimensions 61, 63 and 65. As will be more fully explained in connection with FIGS. 11-18, lateral dimensions 61, 63 and 75, 76 of mask portions 572, 573 and 723, 724 may be the same or different, and lateral spacings 65 and 77 may also be the same or different, to suit the requirements of a given device or IC implementation. Structure 207 results wherein N+ contact regions 741, 745 analogous to contact regions 431, 433 of FIG. 3 are formed, plus N+ emitter regions 742-744 (collectively 74) are formed in PW base region 581 in proximity to PW base humps 583, 584, as indicated by base-width distance arrows 79. In manufacturing stage 108 of FIG. 9, shallow P+ contact implant 44 creates P+ contact regions 491, 492 (collectively 49) through openings 471, 472 (collectively 47) between mask portions 461, 462 and 463 (collectively 46), to provide P+ contact regions 491, 492 in the same manner as in manufacturing stage 103 of FIG. 4. Structure 208 results. In manufacturing stage 109 of FIG. 10, mask 46 is removed and contacts 481, 482, 483, 484, 485, 486, and 487 (collectively 48) made to N+ and P+ doped regions 74 and 49 and appropriate terminals or interconnections provided to couple finished bipolar device 80 to other devices or terminals (not shown) on the same substrate. Dielectric surface passivation 51 is conveniently provided on surface 21 to laterally separate the various contacts 48. Structure 209 results creating bipolar transistor 80 having base width illustrated by arrows 79, for example, much smaller than base width 45 of device 50.

FIGS. 11-18 are simplified schematic cross-sectional views of portions 301-308 of device 80 of FIGS. 6-10, providing additional detail and illustrating how the physical structure and properties of the novel bipolar transistors of FIGS. 6-10 may be varied according to further embodiments of the present invention. Portions 301-304 illustrated in FIGS. 11-14 relate to manufacturing stage 105 of FIG. 6, and portions 305-308 illustrated in FIGS. 15-18 relate to manufacturing stage 107 of FIG. 8. Referring now to portions 301-304 of FIGS. 11-14, wherein widths 61, 63 and spacing 65 of mask portions 572, 573 of FIG. 6 are varied to show how such changes impact hump-shaped profiles 583, 584 of base region 581 of FIG. 6. The convention is adopted of adding another digit to the reference number to illustrate the variations. Thus, different widths 61, 63 of mask portions 572, 573 are identified as widths 611-614, 631-634 of mask portions 5721-5724 and 5731-5734, different spacing 65 is identified as 651-654, and resulting base profiles 583, 584 following P-base implant 25 are identified as 5831-5834 and 5841-5844. Widths 61, 63, spacing 65 and mask portions 572, 573 are intended to refer to such variations collectively.

FIGS. 11-14 illustrate how the shape and location of the P-base profile may be altered by judicious selection of the number and shape of the partially blocking P-base mask portions (e.g., 572, 573, etc.) that are used during manufacture stage 105 of FIG. 6 for bipolar transistor 80. As used herein, the term "partially blocking mask" portions or regions, and "partial blocking mask" portions or regions are intended to refer to: (i) the situation where the mask is thick enough to prevent significant implant penetration through the mask and the implant profile is adjusted by varying the width and/or spacing of the blocking mask portions or regions, and (ii) the situation where the mask may be thin enough to allow some penetration of the implant. Either arrangement is useful. However, mask portions or regions thick enough to fully block local implant penetration are preferred and the implant profile adjusted by controlling the width and/or separation of the various mask portions.

Figure 11:
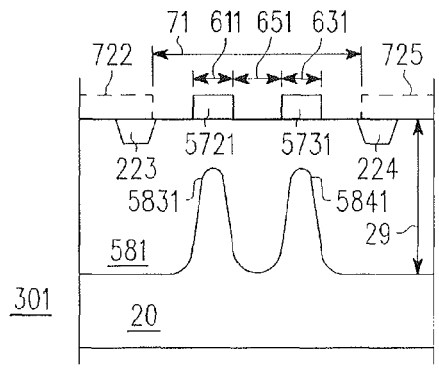
FIGS. 11-18 are simplified schematic cross-sectional views of a portion of the device of FIGS. 6-10, providing additional detail and illustrating how the physical structure and properties of the novel bipolar transistors of FIGS. 6-10 may be varied according to further embodiments of the present invention.
Figure 13:
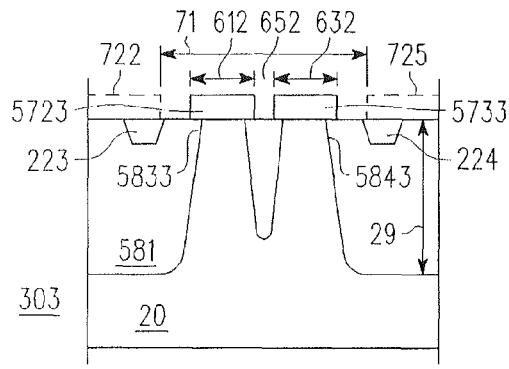
Figure 12:
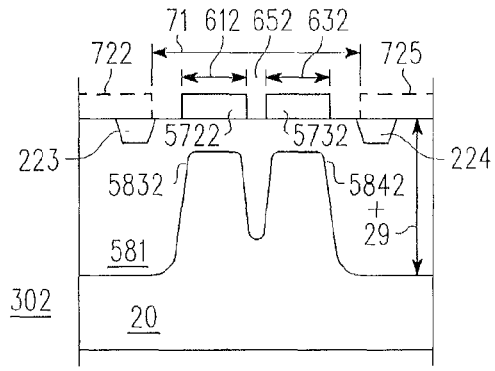
Figure 14:
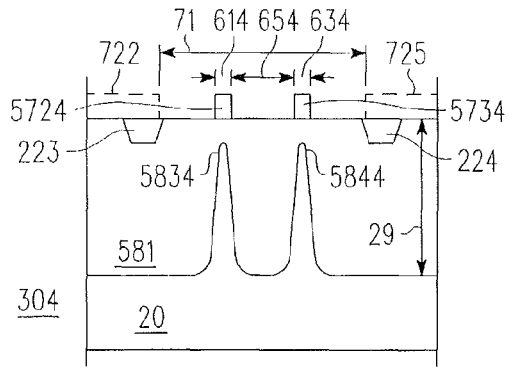
Figure 15:
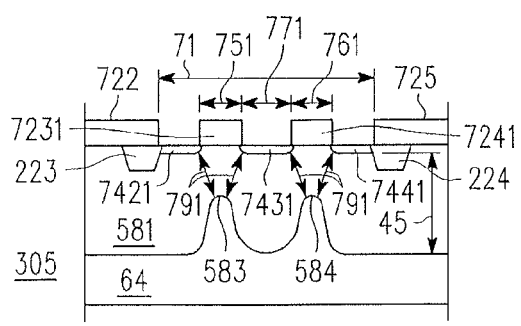

For convenient reference, portion 301 of FIG. 11 reproduces the situation illustrated in FIG. 6. Reference number 71 in FIGS. 11-18 defines the maximum emitter width that is formed between mask portions 722, 725 of FIG. 8 wherein N+ emitter implant 40 is carried out. Portion 302 of FIG. 12 and portion 303 of FIG. 13 illustrates the situation where mask portions 5722, 5732 and 5723, 5733 have the same widths 612, 632 and are wider than widths 611, 631 of FIG. 11, that is, width 71 is the same, width 612 is larger than width 611, width 632 is larger than width 631 and spacing 652 is smaller than spacing 651. Portion 302 of FIG. 12 illustrates the situation where mask portions 5722, 5732 are thin enough so that some of implant 25 passes into P-base region 581, thereby producing flat-topped P-base humps 5832, 5842. However, while useful, this approach may require modification of the underlying MOS process (e.g., adjustment of the mask thickness) and accordingly may be less desirable. Unless specifically stated otherwise it is assumed hereafter that the mask portions are thick enough to substantially block implant penetration there through. Portion 303 illustrates the situation where mask portions 5723, 5733 are thick enough that they completely block implant 25 from underlying regions, thereby producing discontinuous P-base profile 5833, 5843, that is, no P-type doping is located in substrate 20 beneath mask portions 5723, 5733. In general the situation depicted in FIG. 13 is less desirable when forming a bipolar transistor with emitter width 71, but may be useful for other purposes. Portion 304 of FIG. 14 depicts a different situation where mask portions 5724, 5734 with widths 614 and 634 are made narrower, such that width 614 of FIG. 14 is less than width 611 of FIG. 11, width 634 is less than width 631, and spacing 654 is greater than spacing 651. A double humped P base profile with peaks 5834, 5844 located beneath mask portions 5724, 5734 results. It should be noted that the double humped profile of FIGS. 11 and 14 are obtained even if the thickness of mask portions 5721, 5731 and 5724, 5734 are sufficient to block implant 25 from directly beneath these mask portions, because of implant straggle and the lateral diffusion of dopant that occurs during the thermal processing to which transistor 80 is exposed during manufacture. In general, the lateral diffusion distance will be greater nearer to surface 21, so that a continuous base region such as is illustrated in FIGS. 11 and 14 is obtained even when partial blocking mask portions 572, 573 are thick enough to prevent dopant penetration underneath such portions. If the situation depicted in FIG. 13 is to be avoided, then widths 61, 63 should be usefully less than about six times L (i.e., $\leq 6*L$) where L is the lateral profile spread from the combination of implant straggle and lateral diffusion due to thermal processing, more conveniently less than about five times L (i.e., $\leq 5*L$) and preferably less than about four times L (i.e., $\leq 4*L$). Persons of skill in the art will understand how to determine the lateral profile spread L depending upon the dopant, the implant straggle and the thermal budget to which the device will be exposed during manufacture.

While only two mask portions 572, 573 are depicted in FIGS. 6 and 11-14 and elsewhere, this is merely by way of example for convenience of explanation and not intended to be limiting. Persons of skill in the art will understand that any number of partially blocking base mask portions may be used, depending upon the total available emitter width 71. The needed emitter width scales with the current that transistor 80 is required to handle and is thus a parameter to be selected according to the requirements of a given SC device or IC implementation. The larger the value of total emitter width 71, the greater the number of partially blocking base mask portions 572, 573, etc., that may be included.

Figure 17:
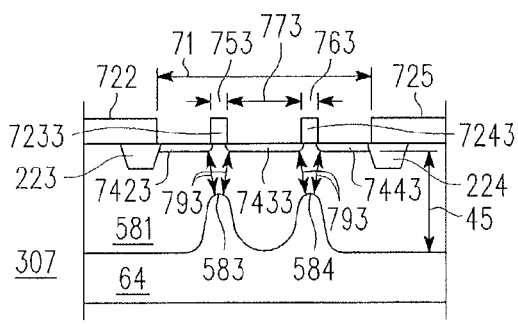
Figure 16:
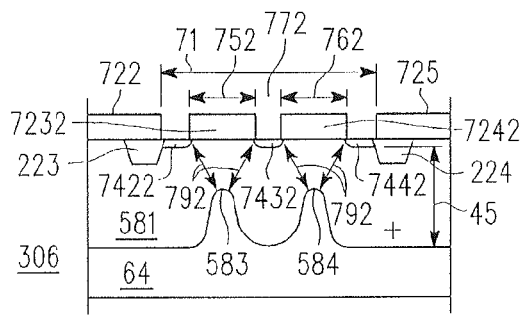
Figure 18:
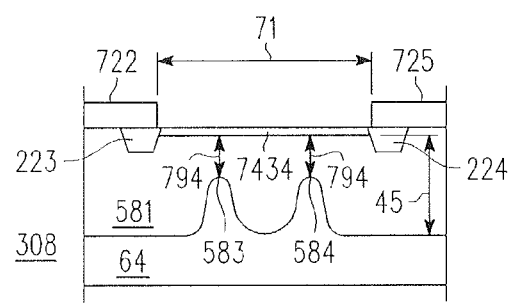

Portions 305-308 of FIGS. 15-18 illustrate how the width and location of the N+ emitter regions relative to the P-base region may be altered by judicious selection of the number and shape of the partially blocking N+ emitter implant mask portions (e.g., 723, 724, etc.) that are used in manufacturing stage 107 of FIG. 8 for bipolar transistor 80. For convenient reference, portion 305 of FIG. 15 reproduces the situation illustrated in FIG. 8. For convenience of explanation, it is assumed in FIGS. 15-18 that the P-base profile corresponds to profile 583, 584 of FIGS. 6-8 and profile 5831, 5841 of FIG. 11. What is being varied in FIGS. 15-18 are widths 75, 76 and spacing 77 of partial emitter blocking mask portions 723, 724 of FIG. 8. The same convention is followed as in connection with FIGS. 11-14, that is, an extra digit is added to the general reference number to separately identify the variations. For example, in FIGS. 15-18, width 75 has variations 751-753, width 76 has variations 761-763, spacing 77 has variations 771-773, emitter portions 742-744 have variations 7421-7423, 7431-7433 and 7441-7443 and mask portions 723, 724 have variations 7231-7233 and 7241-7243 and where reference numbers 75, 76, 77, 723-724 and 742-744 refer to their respective variations collectively. Reference number 71 in FIGS. 11-18 defines the maximum emitter width that is formed between mask portions 722, 725 of manufacturing stage 107 of FIG. 8 wherein N+ emitter implant 40 is carried out. Portion 306 of FIG. 16 illustrates the situation where width 71 is the same and partial blocking mask portions 7232, 7242 having widths 752, 762 are wider than partial mask blocking portions 7231, 7241 of FIG. 15. That is, width 752 is larger than width 751, width 762 is larger than width 761 and spacing 772 is smaller than spacing 771 during N+ emitter implant 40 of manufacturing stage 107 of FIG. 8. As a consequence, emitter portions 7422, 7432 and 7442 of FIG. 16 are smaller (laterally narrower) than emitter portions 7421, 7431, and 7441 of FIGS. 8 and 15. As a consequence, the effective base width shown by arrows 792 of FIG. 16 is larger than the effective base width shown by arrows 791 of FIG. 15. Portion 307 of FIG. 17 illustrates the situation where width 71 is the same and partial blocking mask portions 7233, 7243 having widths 753, 763 are smaller than partial mask blocking portions 7231, 7241 of FIG. 15. That is, width 753 is smaller than width 751, width 763 is smaller than width 761 and spacing 773 is larger than spacing 771 during N+ emitter implant 40 of manufacturing stage 107 of FIG. 8. As a consequence, emitter portions 7423, 7433 and 7443 of FIG. 17 are larger (laterally wider) than emitter portions 7421, 7431, and 7441 of FIGS. 8 and 15. As a consequence, the effective base width shown by arrows 793 of FIG. 17 is smaller than the effective base width shown by arrows 791 of FIG. 15. Portion 308 of FIG. 18 illustrates the situation where partial N+ emitter mask blocking portions 723, 724 are omitted entirely during emitter implant 40 of FIG. 8, so that continuous N+ emitter 7434 is produced in FIG. 18. As a consequence, the maximum emitter area is provided and the effective base width shown by arrows 794 has its smallest value.

Figure 10:
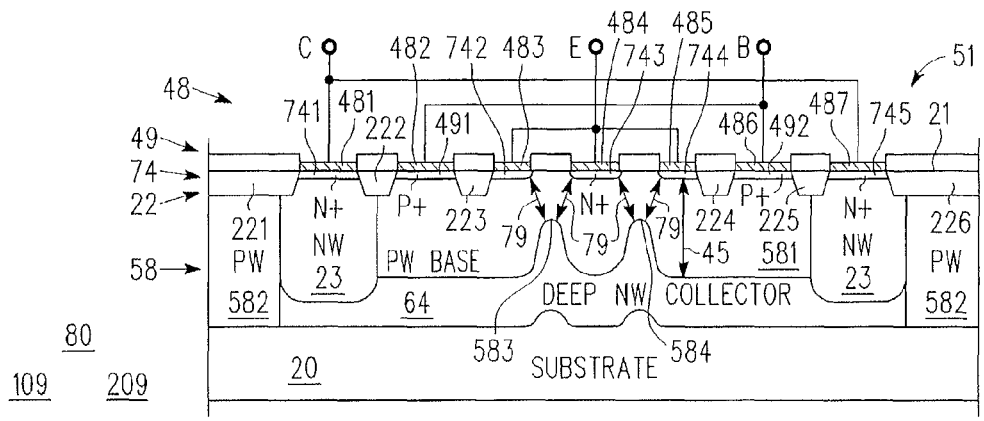

Table I below compares the properties of device 50 of FIG. 5 and device 80 of FIG. 10, obtained by computer simulation. In these devices, depth 35 of the PW base 281, 581 was about 0.7 micrometers. Distance 45 from emitter 43, 74 to collector 34, 64 was about 0.6 micrometers. Maximum emitter opening width 71 was about 2.0 micrometers. Other than the geometric changes brought about by the various partial implant blocking mask portions, the analyzed devices were substantially the same. Four variations of device 80 were examined, devices 80-1, 80-2, 80-3, 80-4. In all of these devices the partial blocking mask widths 61, 63 were set to about 0.33 micrometers, with spacing 65 of about 0.5 micrometers during P-base implant step 105 of FIG. 6. The partial blocking mask widths and spacing during the emitter implant step 107 of FIG. 8 were varied. For device 80-1, widths 75, 76 in N+ emitter implant stage 107 were equal to widths 61, 63 of P-base implant stage 105 plus about 0.15 micrometers and spacing 77 was about 0.35 micrometers, thereby yielding emitter regions 7422, 7432 and 7442 (see FIG. 16). For device 80-2, widths 75, 76 in N+ emitter implant stage 107 were equal to widths 61, 63 of P-base implant stage 105 and spacing 77 was about 0.5 micrometers, thereby yielding emitter regions 7421, 7431 and 7441 (see FIG. 15) each of slightly larger size compared to device 80-1. For device 80-3 widths 75, 76 in N+ emitter implant stage 107 were equal to widths 61, 63 of P-base implant stage 105 minus about 0.15 micrometers and spacing 77 was about 0.65 micrometers, thereby yielding emitter regions 7423, 7433 and 7443 (see FIG. 17) of still larger size compared to device 80-1. For device 80-4, partial implant blocking mask portions 723, 724 of FIG. 8 were omitted so that continuous emitter 7434 (see FIG. 18) of about lateral size 71 was formed. The gain (Beta) and breakdown voltage under various conditions of device 50 and devices 80-1 . . . 80-4 were determined by simulation and the results are presented in Table I below. Voltages (V) are given in volts.

TABLE I

Comparative Properties of Bipolar Transistors made using CMOS Process

| Device Parameters | Device 50 | Device 80-1 | Device 80-2 | Device 80-3 | Device 80-4 |
|---|---|---|---|---|---|
| Beta @ Vc = 0 V | 2.15 | 11.77 | 15.6 | 17.7 | 21.8 |
| Beta @ Vc = 3 V | 2.22 | 13.6 | 20.1 | 26.3 | 41.9 |
| Bvebo (V) | 9.08 | 8.96 | 9.23 | 9.17 | 9.23 |
| Bvcbo (V) | 11.36 | 11.34 | 11.35 | | |
| BVceo (V) | 11.88 | 11.71 | 11.62 | 9.35 | 6.08 |
| Early voltage (V) | −523.7 | −67.9 | −49.7 | −28.2 | −10.1 |

It will be noted that by varying the size of partial blocking masks 723, 724 during emitter implant step 107 of FIG. 8, a variety of gains and breakdown voltages can be obtained to suit the particular implementation needs for bipolar device 80 made using an otherwise unmodified CMOS process.

Persons of skill in the art will understand based on the description herein that altering the partial implant blocking mask portions for the bipolar transistor using only mask changes, does not affect any of the CMOS devices being made elsewhere on substrate 20 during the same manufacturing stages or the processes used to make such CMOS transistors. Because of the novel bipolar SC device integration described herein, none of the available CMOS processing steps need be modified and no further process steps need be added. By modifying one or more of portions 572, 573 of P-base implant 25 of FIG. 6 and/or in these and other embodiments, portions 622, 623 of deep NW collector implant 30 of FIG. 7 where such implant is included, and/or portions 723, 724 of shallow N+ emitter implant 40 of FIG. 8, the properties of bipolar device 80 can be substantially modified, allowing such properties to be tailored to the requirements of a given bipolar SC device or IC implementation without having to modify the underlying CMOS process parameters, process steps or process flow. This significantly enhances the ability to incorporate bipolar devices having desirable properties in the same IC being otherwise formed using the unmodified MOS process. This is highly desirable.

According to a first embodiment, there is provided a method (105-109) for forming a bipolar semiconductor device (80) employing a MOS device process (105-109) having a first conductivity well forming step (105) and a shallow second, opposite, conductivity type contact region forming step (107), comprising, providing (105) a semiconductor substrate (20) having a first surface (21), using the first conductivity type well forming step (105) in conjunction with one or more first partial blocking mask portions (572, 573) on the first surface (21) to form a first conductivity type base region (581) of the bipolar semiconductor device (80) having one or more first hump regions (583, 584) nearer the first surface (21) underlying the one or more first partial blocking mask portions (572, 573), and using the shallow second, opposite, conductivity type contact region forming step (107), forming an emitter region (742-744) in the base region (581) proximate the first surface (21), adapted to function in cooperation with the hump regions. According to a further embodiment, wherein the MOS process (105-109) further comprises a shallow first conductivity type contact region forming step (108), the method further comprises, forming one or more first conductivity type contact regions (49) in the base region (581) proximate the first surface (21) using the shallow first conductivity type contact region forming step (108). According to a still further embodiment, wherein the MOS process (105-109) further comprises a deep well forming step (106) of the second, opposite, conductivity type, the method further comprises forming (106) a collector region (64) of the bipolar transistor (80) underlying the base region (581) using the deep well forming step (106). According to a yet further embodiment, the step (107) of forming the emitter region (74) comprises providing other partial blocking mask portions (72) during formation of the emitter region (74) so that the emitter region (74) does not form a continuous sheet, but is interrupted in regions underlying the other partial blocking mask portions (72). According to a still yet further embodiment, the other partial blocking mask portions (72) are substantially aligned with the first partial blocking mask portions (57). According to a yet still further embodiment, wherein each of the first partial blocking mask portions (57) has a first width (61, 63) and each of the other partial mask blocking portions (72) has another width (75, 76) and wherein the first width (61, 63) exceeds the another width (75, 76). According to a still yet further embodiment, each of the first partial blocking mask portions (57) has a first width (61, 63) and each of the other partial mask blocking portions (72) has another width (75, 76) and the first width (61, 63) is less than the another width (75, 76). According to another embodiment, each of the first partial blocking mask portions (57) has a first width (61, 63) and each of the other partial mask blocking portions (72) has another width (75, 76) and the first width (61, 63) is approximately equal to the another width (75, 76). According to a still another embodiment, one or more of the partial mask blocking portions (57, 72) are formed from photoresist on the first surface (21). According to a yet another embodiment, the photoresist forming the first partial mask blocking portions (57) has a thickness sufficient to prevent significant penetration of implanted ions (25) beneath the first surface (21).

According to a second embodiment, there is provided a method (105-109) for making bipolar devices (80) using a MOS process (105-109) having N and P well doping capability and N and P type contact doping capability, using prescribed mask modifications for forming the bipolar devices (80), comprising, providing (105) a semiconductor substrate (20) having a first surface (21) and then in any order, providing (107) an emitter region (74) of a first conductivity type proximate the first surface (21) using the N or P type contact doping capability, and providing (105) a base region (581) of a second, opposite, (25) conductivity type in the substrate (20) using the N or P well doping capability, wherein the N or P well doping is partially blocked so as to provide an effective base width (79) that varies laterally within the bipolar device (80). According to a further embodiment, the step (107) of providing the emitter region (74) comprises, using the N or P type contact doping capability wherein the N or P type contact doping is partially blocked so as to provide an effective base width (79) that varies laterally within the bipolar device (80). According to a still further embodiment, a first mask region (72) responsible for partially blocking the N or P type contact doping (40) for the emitter (74) is substantially aligned with a location of a second mask region (57) responsible for partially blocking the P or N well doping (25) for the base region (581). According to a yet further embodiment, the first (72) and second (57) mask regions have substantially the same widths (75, 76 and 61, 63). According to a still yet further embodiment, the widths (75, 76) of the first mask region (72) are larger than the widths (61, 63) of the second mask region (57). According to a yet still further embodiment, the widths (75, 76) of the first mask region (72) are narrower than the widths (61, 63) of the second mask region (57).

According to a third embodiment, there is provided a bipolar device (80), comprising, an emitter region (74) proximate a first surface (21) of the device (80), a base region (581) lying below the emitter region (74), and a collector region (64) lying below the base region (581), wherein a collector-base boundary has an undulating profile (585') with one or more humps (583, 584) that are closer to the emitter (74) than other portions (283') of the collector-base boundary. According to a further embodiment, the bipolar device (80) is formed using a MOS process (105-109) to create the undulating collector base boundary (585') by adding first partially blocking mask portions (57) during formation of the base region (581) of the device (80). According to a still further embodiment, the bipolar device (80) is further formed by adding second partially blocking mask portions (72) during formation of the emitter region (74) of the device (80). According to a yet further embodiment, the bipolar device (80) is further formed by adding third partially blocking mask portions (62) during formation (106) of the collector region (64) of the device (80).

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims and their legal equivalents.

What is claimed is:

1. A bipolar device, comprising:
   a plurality of emitter regions proximate a first surface of the device;
   a base region lying below the plurality of emitter regions; and
   a collector region lying below the base region, wherein a collector-base boundary has an undulating profile with one or more humps, wherein the plurality of emitter regions are separated at the first surface by one or more portions of the base region, and wherein each of the one or more humps is vertically aligned with a different portion of the base region separating the plurality of emitter regions.

2. The device of claim 1, wherein the bipolar device is formed using a MOS process to create the undulating collector-base boundary by adding first partially blocking mask portions during formation of the base region of the device.

3. The device of claim 2, wherein the bipolar device is further formed by adding second partially blocking mask portions during formation of the plurality of emitter regions of the device.

4. The device of claim 3, wherein the bipolar device is further formed by adding third partially blocking mask portions during formation of the collector region of the device.

5. The device of claim 1, wherein the one or more humps are located between lateral boundaries of the base region.

6. The device of claim 1, wherein each of the one or more hump regions has a flat top.

7. The device of claim 1, wherein each of the one or more hump regions extend to the first surface, resulting in a discontinuous base region profile.

8. A bipolar semiconductor device comprising:
   a semiconductor substrate having a first surface;
   a base region having an undulating lower boundary at least partially defined by two laterally-spaced hump regions each having a rounded top;
   an emitter region in the base region proximate the first surface, wherein the emitter region is adapted to function in cooperation with the two laterally-spaced hump regions; and
   a collector region underlying the base region.

9. The device of claim 8, further comprising:
   one or more first conductivity type contact regions in the base region proximate the first surface.

10. The device of claim 8, wherein the emitter region comprises a plurality of emitter regions separated at the first surface by portions of the base region, wherein each of the two laterally-spaced hump regions is vertically aligned with one of the portions of the base region.

11. The device of claim 8, wherein the emitter region comprises a single emitter region that extends over each of the two laterally-spaced hump regions.

12. The device of claim 8, wherein the two laterally-spaced hump regions are located between lateral boundaries of the base region.

* * * * *